United States Patent
Hung et al.

(10) Patent No.: US 11,411,574 B2
(45) Date of Patent: Aug. 9, 2022

(54) CLOCK AND DATA RECOVERY CIRCUIT WITH PROPORTIONAL PATH AND INTEGRAL PATH, AND MULTIPLEXER CIRCUIT FOR CLOCK AND DATA RECOVERY CIRCUIT

(71) Applicant: M31 TECHNOLOGY CORPORATION, Hsinchu County (TW)

(72) Inventors: Cheng-Liang Hung, Hsinchu (TW); Ching-Hsiang Chang, Hsinchu (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 17/215,428

(22) Filed: Mar. 29, 2021

(65) Prior Publication Data
US 2021/0314135 A1 Oct. 7, 2021

Related U.S. Application Data

(60) Provisional application No. 63/005,943, filed on Apr. 6, 2020.

(51) Int. Cl.
*H03D 3/24* (2006.01)
*H03M 1/46* (2006.01)
(Continued)

(52) U.S. Cl.
CPC ............ *H03M 1/466* (2013.01); *G05F 1/461* (2013.01); *G05F 1/468* (2013.01); *H03L 7/0807* (2013.01);
(Continued)

(58) Field of Classification Search
CPC .... H03M 1/466; H03M 1/462; H03M 1/1245; G05F 1/461; G05F 1/468; H04B 1/40;
(Continued)

(56) References Cited

U.S. PATENT DOCUMENTS

7,345,550 B2 3/2008 Bellaouar et al.
8,811,555 B2 8/2014 Asaduzzaman et al.
(Continued)

FOREIGN PATENT DOCUMENTS

JP 2012004701 1/2012

OTHER PUBLICATIONS

English Abstract of JP 2012-004701.
Taiwan office action for corresponding TW application 110112428 dated Nov. 2, 2021.

*Primary Examiner* — Phuong Phu
(74) *Attorney, Agent, or Firm* — WPAT, P.C., Intellectual Property Attorneys; Anthony King

(57) ABSTRACT

A clock and data recovery circuit includes a phase detector (PD), a phase frequency detector (PFD), a multiplexer circuit, a conversion stage and an oscillator. The PD detects a difference in phase between a data signal and an oscillating signal to generate a first set of error signals. The PFD detects a difference in phase and frequency between a reference clock signal and the oscillating signal to generate a second set of error signals. The multiplexer circuit selectively outputs the first set of error signals or the second set of error signals as a third set of error signals according to a selection signal. The conversion stage determines a set of gains according to the selection signal, and converts the third set of error signals with the set of gains to generate a set of input signals. The oscillator generates the oscillating signal according to the set of input signals.

21 Claims, 5 Drawing Sheets

(51) Int. Cl.
  *H03M 1/12* (2006.01)
  *G05F 1/46* (2006.01)
  *H04B 1/40* (2015.01)
  *H03L 7/08* (2006.01)
  *H03L 7/089* (2006.01)
  *H04L 7/033* (2006.01)

(52) U.S. Cl.
  CPC ........ *H03L 7/0891* (2013.01); *H03M 1/1245* (2013.01); *H03M 1/462* (2013.01); *H04B 1/40* (2013.01); *H04L 7/0331* (2013.01)

(58) Field of Classification Search
  CPC ... H03L 7/0807; H03L 7/0891; H04L 7/0331; H04L 7/0337; H04L 7/0004
  USPC .................................. 375/327, 326, 373–376
  See application file for complete search history.

(56) References Cited

U.S. PATENT DOCUMENTS

| | | |
|---|---|---|
| 8,878,614 B2 | 11/2014 | Yin et al. |
| 9,716,582 B2 | 7/2017 | Ramezani et al. |
| 2011/0215848 A1 | 9/2011 | Koroglu et al. |
| 2014/0064423 A1* | 3/2014 | Chen .................... H04L 7/0004 375/374 |
| 2014/0177771 A1* | 6/2014 | Maruko ................ H04L 7/0337 375/375 |
| 2019/0372575 A1 | 12/2019 | Wu |

* cited by examiner

CLOCK AND DATA RECOVERY CIRCUIT WITH PROPORTIONAL PATH AND INTEGRAL PATH, AND MULTIPLEXER CIRCUIT FOR CLOCK AND DATA RECOVERY CIRCUIT

PRIORITY CLAIM AND CROSS-REFERENCE

The present application claims priority to U.S. Provisional Patent Application No. 63/005,943, filed on Apr. 6, 2020, which is incorporated by reference herein in its entirety.

BACKGROUND

The present disclosure relates to clock and data recovery (CDR) and, more particularly, to a clock and data recovery circuit with a proportional path and an integral path, and a related multiplexer circuit.

To retrieve data from a data stream transmitted without additional timing information, a receiving end may perform clock recovery to extract a clock signal embedded in level transitions in the data stream. In addition, the receiving end phase-aligns the clock signal to the level transitions in the data stream, and sample the data stream to recover the data from the data stream. The process described above is commonly known as clock and data recovery (CDR). For example, a high-speed serial interface may utilize a CDR circuit to extract timing information from a data stream and accordingly decode the transmitted symbols in the data stream. The CDR circuit may use a phase-locked loop to generate a high-speed clock signal, which is phase-aligned to level transitions in the data stream. The high-speed clock signal is used to sample and regenerate the data stream.

SUMMARY

The described embodiments provide a clock and data recovery circuit, which includes a conversion stage shared among different tracking loops including, for example, a frequency tracking loop and a phase tracking loop. The described embodiments further provide a multiplexer circuit having reduced glitches during operation thereof.

Some embodiments described herein may include a clock and data recovery (CDR) circuit. The CDR circuit includes a phase detector (PD), a phase frequency detector (PFD), a multiplexer circuit, a conversion stage and an oscillator. The PD is configured to detect a difference in phase between a data signal and an oscillating signal to generate a first set of error signals. The PFD is configured to detect a difference in phase and frequency between a reference clock signal and the oscillating signal to generate a second set of error signals. The multiplexer circuit, coupled to the PD and the PFD, is configured to selectively output the first set of error signals or the second set of error signals as a third set of error signals according to a selection signal. The conversion stage, coupled to the multiplexer circuit, is configured to determine a set of gains according to the selection signal, and convert the third set of error signals with the set of gains to generate a set of input signals. The oscillator, coupled to the conversion stage, is configured to generate the oscillating signal according to the set of input signals.

Some embodiments described herein may include a clock and data recovery (CDR) circuit. The CDR circuit includes a phase detector (PD), a phase frequency detector (PFD), a synchronization circuit, a selection circuit, a conversion stage and an oscillator. The PD is configured to detect a difference in phase between a data signal and an oscillating signal to generate a first set of error signals. The PFD is configured to detect a difference in phase and frequency between a reference clock signal and the oscillating signal to generate a second set of error signals. The synchronization circuit is configured to sample a selection signal according to the reference clock signal, and accordingly generate an enable signal. The selection circuit, coupled to the PD, the PFD and the synchronization circuit, is configured to selectively output the first set of error signals or the second set of error signals as a third set of error signals according to the enable signal. The conversion stage, coupled to the selection circuit, is configured to convert the third set of error signals with a set of gains to generate a set of input signals. The oscillator, coupled to the conversion stage, is configured to generate the oscillating signal according to the set of input signals.

Some embodiments described herein may include a multiplexer circuit. The multiplexer circuit includes a synchronization circuit, a first multiplexer and a second multiplexer. The synchronization circuit is configured to sample a selection signal at one of a first signal edge of a reference clock signal, and generate an enable signal at a second signal edge of the reference clock signal different from the first signal edge. One of the first signal edge and the second signal edge is a rising edge, and the other of the first signal edge and the second signal edge is a falling edge. The first multiplexer, coupled to the synchronization circuit, is configured to receive a first up signal outputted from a phase detector (PD) and a second up signal outputted from a phase frequency detector (PFD), output one of the first up signal and the second up signal as a first control signal according to the enable signal, and increase a frequency of an oscillator according to the first control signal. The second multiplexer, coupled to the synchronization circuit, is configured to receive a first down signal outputted from the PD and a second down signal outputted from the PFD, output one of the first down signal and the second down signal as a second control signal according to the enable signal, and decrease the frequency of the oscillator according to the second control signal.

With the use of the proposed CDR scheme, respective sets of error signals provided by a PD and a PFD can be converted by a same conversion stage with a set of adjustable gains. For example, the conversion stage operative in a PLL mode can be reused in a CDR mode, wherein a set of gains of the conversion stage can be adjusted/determined in response to a mode of operation of a CDR circuit. The CDR circuit utilizing the proposed CDR scheme can therefore have a simplified design, a relatively small circuit area and reduced manufacturing costs. Additionally, with the use of the proposed multiplexing scheme, signal selection can be synchronized with a clock signal, such as a reference clock signal for triggering a phase frequency detector employed for a phase-locked loop, to thereby reduce glitches induced during the signal selection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
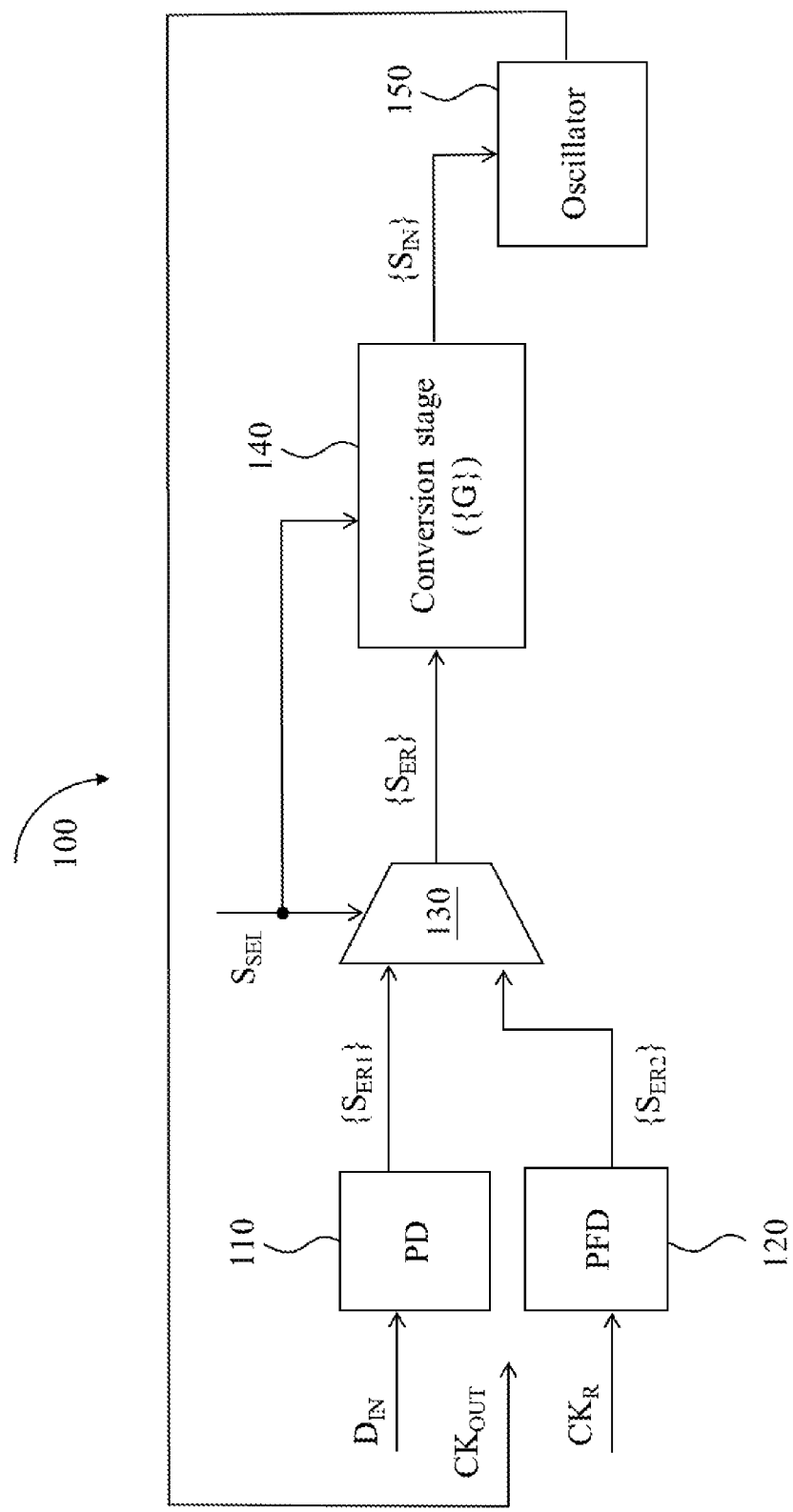
FIG. 1 is a block diagram illustrating an exemplary clock and data recovery circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, parameter values in the description that follows may vary depending on a given technology node. As another example, parameter values for a given technology node may vary depending on a given application or operating scenario. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

A CDR circuit employing a PLL design, e.g. a PLL-based CDR circuit, may utilize two conversion stages dedicated to two phase sensitive detectors respectively. For example, the CDR circuit may utilize a phase frequency detector (PFD) and a corresponding gain conversion stage to implement the PLL design. The CDR circuit may further utilize a phase detector (PD) and another gain conversion stage, thereby perform phase tracking of an output clock obtained using the PLL design. However, as the PFD would be unused in a CDR mode where the phase tracking is performed, the conversion stage associated with the PFD would stand idle. The use of dedicated conversion stages will result in increased circuit areas and costs.

The present disclosure describes exemplary CDR circuits, each of which includes a conversion stage shared among different tracking loops including, for example, a frequency tracking loop and a phase tracking loop. In some embodiments, at least one gain provided by the shared conversion stage may vary according to a mode of operation of the CDR circuit. The present disclosure further describes exemplary multiplexer circuits. Each of the multiplexer circuits can be configured to couple one of two phase sensitive detectors, used for a frequency tracking loop and a phase tracking loop respectively, to a conversion stage shared among the frequency tracking loop and the phase tracking loop. The exemplary multiplexer circuits have reduced glitches during operation thereof. Further description is provided below.

FIG. 1 is a block diagram illustrating an exemplary CDR circuit in accordance with some embodiments of the present disclosure. The CDR circuit 100 can be configured to recover timing information carried by a data signal $D_{IN}$, such as a data stream, and accordingly regenerate the data signal $D_{IN}$ according to the recovered timing information. The CDR circuit 100 includes, but is not limited to, a PD 110, a PFD 120, a multiplexer circuit 130, a conversion stage 140 and an oscillator 150. In the present embodiment, the PD 110 can be used together with the conversion stage 140 to implement a phase tracking loop, while the PFD 120 can be used together with the conversion stage 140 to implement a frequency tracking loop. The PFD 120, the multiplexer circuit 130, the conversion stage 140 and the oscillator 150 may form at least a portion of a PLL.

The PD 110 is configured to detect a difference in phase between the data signal $D_{IN}$ and an oscillating signal $CK_{OUT}$ to generate a set of error signals $\{S_{ER1}\}$. The PD 110 may be implemented using a phase only sensitive detector, such as an exclusive-OR (XOR) phase detector or other types of digital/analog phase detectors sensitive to phase. In some embodiments, the PD 110 can be implemented using a phase-frequency sensitive detector without departing from the scope of the present disclosure.

The PFD 120 is configured to detect a difference in phase and frequency between a reference clock signal $CK_R$ and the oscillating signal $CK_{OUT}$ to generate a set of error signals {SERE}. The PFD 120 may be implemented using various detectors which are phase-frequency sensitive. By way of example but not limitation, the PFD 120 may be implemented using an edge triggered 1K flip-flop PFD or other types of PFD. In some embodiments, the PFD 120 may be implemented using a phase sensitive detector when the reference clock signal $CK_R$ and the oscillating signal $CK_{OUT}$ are close in frequency.

The multiplexer circuit 130, coupled to the PD 110 and the PFD 120, is configured to selectively output the set of error signals $\{S_{ER1}\}$ or the set of error signals $\{S_{ER2}\}$ as a set of error signals $\{S_{ER}\}$ according to a selection signal $S_{SEL}$. For example, when the selection signal $S_{SEL}$ indicates that the CDR circuit 100 operates in a mode where one of the PD 110 and PFD 120 is active, the set of error signals $\{S_{ER}\}$ may come from the one of the PD 110 and PFD 120. The other of the PD 110 and PFD 120 may be inactive in the mode.

The conversion stage 140, coupled to the multiplexer circuit 130, is configured to determine a set of gains $\{G\}$ according to the selection signal $S_{SEL}$, and convert the set of error signals $\{S_{ER}\}$ with the set of gains $\{G\}$ to generate a set of input signals $\{S_{IN}\}$. It is worth noting that at least one gain in the set of gains $\{G\}$ can vary in response to the selection signal $S_{SEL}$. In some embodiments, a portion of the set of error signals $\{S_{ER}\}$ is converted with a gain included in the set of gains $\{G\}$ which varies in response to the selection signal $S_{SEL}$. Another portion of the set of error signals $\{S_{ER}\}$ is converted with another gain included in the set of gains $\{G\}$ which stays constant even if the selection signal $S_{SEL}$ changes.

The oscillator 150, coupled to the conversion stage 140, is configured to generate the oscillating signal $CK_{OUT}$ according to the set of input signals $\{S_{IN}\}$, wherein the set of input signals $\{S_{IN}\}$ can serve as a set of control inputs of the oscillator 150. The oscillator 150 may be implemented using a voltage controlled oscillator (VCO), a current controlled oscillator (CCO), a digital controlled oscillator (DCO), a hybrid current/voltage controlled oscillator, or other types of oscillators.

In operation, when the selection signal $S_{SEL}$ indicates that the CDR circuit 100 operates in a PLL mode to perform frequency tracking or coarse tracking, the multiplexer circuit 130 may output the set of error signals {$S_{ER2}$}, indicating the difference in phase and frequency between the reference clock signal $CK_R$ and the oscillating signal $CK_{OUT}$, as the set of error signals {$S_{ER}$} according to the selection signal $S_{SEL}$. The conversion stage 140 may generate the set of input signals {$S_{IN}$} by converting the set of error signals {$S_{ER}$} with the set of gains {G}, which is determined according to the selection signal $S_{SEL}$. The oscillator 150 may generate an updated version of the oscillating signal $CK_{OUT}$ according to the set of input signals {$S_{IN}$}.

After the oscillating signal $CK_{OUT}$ is locked to the reference clock signal $CK_R$, a signal level or signal pattern of the selection signal $S_{SEL}$ may change to indicate that the CDR circuit 100 operates in a CDR mode to perform phase tracking or fine tracking. The multiplexer circuit 130 may output the set of error signals {$S_{ER1}$}, which indicates the difference in phase between the data signal $D_{IN}$ and the oscillating signal $CK_{OUT}$, as the set of error signals {$S_{ER}$} according to the selection signal $S_{SEL}$. The conversion stage 140 may generate the set of input signals {$S_{IN}$} by converting the set of error signals {$S_{ER}$} with the set of gains {G}, which is determined according to the selection signal $S_{SEL}$. The set of gains {G} employed in the CDR mode may have a set of gain values different from that of the set of gains {G} employed in the PLL mode. By way of example but not limitation, in the PLL mode, a gain in the set of gains {G} has a first gain value. In the CDR mode, the gain in the set of gains {G} has a second gain value less than the first gain value. Next, the oscillator 150 may generate an updated version of the oscillating signal $CK_{OUT}$. When the oscillating signal $CK_{OUT}$ is locked to the data signal $D_{IN}$, the data signal $D_{IN}$ and the reference clock signal $CK_R$ may be sent to a decision circuit (not shown in FIG. 1) for data regeneration.

With the use of the proposed CDR scheme, respective sets of error signals provided by a PD and a PFD can be converted by a same conversion stage with a set of adjustable gains. For example, a CDR circuit may operate in a PLL mode to act as a PLL, and operate in a CDR mode to lock a phase of an output clock of the PLL to that of a data input of the CDR circuit. The conversion stage operative in the PLL mode can be reused in the CDR mode, wherein a set of gains of the conversion stage can be adjusted/determined in response to a mode of operation of the CDR circuit. Compared with a CDR circuit utilizing two conversion stages dedicated to the PLL mode and the CDR mode, the CDR circuit utilizing the proposed CDR scheme can have a simplified design, a relatively small circuit area and reduced manufacturing costs.

To facilitate understanding of the present disclosure, some embodiments are given as follows for further description of the proposed CDR scheme. Those skilled in the art should appreciate that other embodiments employing the architecture shown in FIG. 1 are also within the contemplated scope of the present disclosure.

Figure 2:
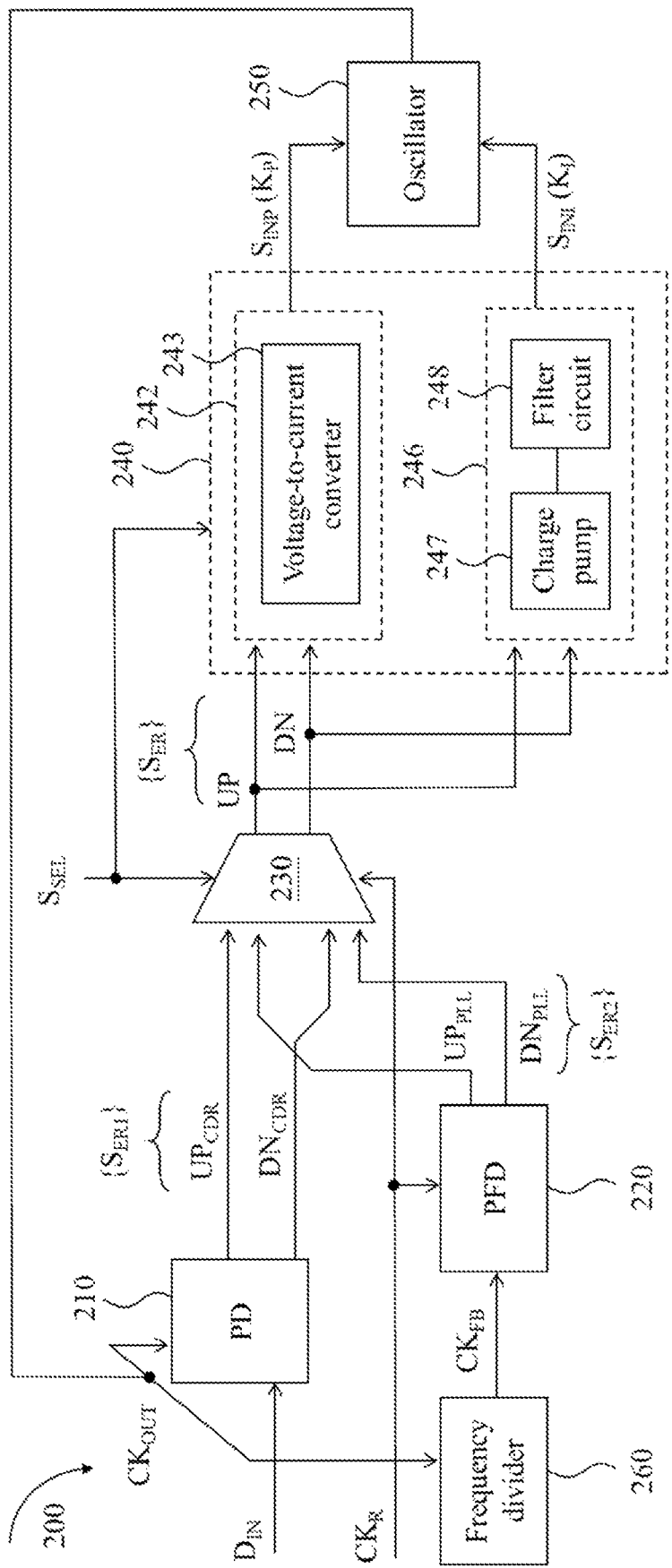
FIG. 2 illustrates an implementation of the clock and data recovery circuit shown in FIG. 1 in accordance with some embodiments of the present disclosure.

FIG. 2 illustrates an implementation of the CDR circuit 100 shown in FIG. 1 in accordance with some embodiments of the present disclosure. The CDR circuit 200 includes, but is not limited to, a PD 210, a PFD 220, a multiplexer circuit 230, a conversion stage 240 and an oscillator 250, which can represent embodiments of the PD 110, the PFD 120, the multiplexer circuit 130, the conversion stage 140 and the oscillator 150 shown in FIG. 1 respectively.

The CDR circuit 200 may operate in a CDR mode and a PLL mode. In the CDR mode, the PD 210 is configured to detect a difference in phase between the data signal $D_{IN}$ and the oscillating signal $CK_{OUT}$ to generate the set of error signals {Seri}, which includes an up signal $UP_{CDR}$ and a down signal $DN_{CDR}$. In the PLL mode, the PFD 220 is configured to detect a difference in phase between the reference clock signal $CK_R$ and the oscillating signal $CK_{OUT}$ to generate the set of error signals {$S_{ER2}$}, which includes an up signal $UP_{PLL}$ and a down signal $DN_{PLL}$. In the present embodiment, the CDR circuit 200 may further include a frequency divider 260, which is coupled between the oscillator 250 and the PFD 220. The frequency divider 260 can be configured to receive the oscillating signal $CK_{OUT}$ to generate a frequency-divided signal $CK_{FB}$. As a result, the PFD 220 can be configured to receive the reference clock signal $CK_R$ and the frequency-divided signal $CK_{FB}$ to detect the difference in phase and frequency between the reference clock signal $CK_R$ and the oscillating signal $CK_{OUT}$.

For example, the PD 210 may generate the up signal $UP_{CDR}$ with a predetermined logic level when the oscillating signal $CK_{OUT}$ lags the data signal $D_{IN}$, and generates the down signal $DN_{CDR}$ with a predetermined logic level when the oscillating signal $CK_{OUT}$ leads the data signal $D_{IN}$. As another example, the PFD 220 may generate the up signal $UP_{PLL}$ with a predetermined logic level when the frequency-divided signal $CK_{FB}$ lags the reference clock signal $CK_R$, and generates the down signal $DN_{PLL}$ with a predetermined logic level when the frequency-divided signal $CK_{FB}$ leads the reference clock signal $CK_R$.

The multiplexer circuit 230 is configured to output one of the up signal $UP_{CDR}$ and the up signal $UP_{PLL}$ as an up signal UP according to the selection signal $S_{SEL}$, and output one of the down signal $DN_{CDR}$ and the down signal $DN_{PLL}$ as a down signal DN according to the selection signal $S_{SEL}$. The up signal UP and the down signal DN outputted from the multiplexer circuit 230 can serve as at least a portion of the set of error signals {$S_{ER}$}. For example, when the selection signal $S_{SEL}$ indicates that the CDR circuit 200 operates in the CDR mode, the multiplexer circuit 230 is configured to output the up signal $UP_{CDR}$ as the up signal UP, and output the down signal $DN_{CDR}$ as the down signal DN. When the selection signal $S_{SEL}$ indicates that the CDR circuit 200 operates in the PLL mode, the multiplexer circuit 230 is configured to output the up signal $UP_{PLL}$ as the up signal UP, and output the down signal $DN_{PLL}$ as the down signal DN.

The conversion stage 240 is configured to convert the up signal UP and the down signal DN with a plurality of gains $K_P$ and $K_I$, which can serve as an embodiment of the set of gains {G} shown in FIG. 1. The conversion stage 240 may include a plurality of conversion circuits 242 and 246. The conversion circuit 242 is configured to convert the up signal UP and the down signal DN with the gain $K_P$ to generate an input signal $S_{INP}$, which can serve as an embodiment of an input signal in the set of input signals {$S_{IN}$} shown in FIG. 1. The gain $K_P$ can be adjusted/determined by the conversion circuit 242 according to the selection signal $S_{SEL}$. By way of example but not limitation, when the selection signal $S_{SEL}$ indicates the CDR circuit 200 operates in the PLL mode, the gain $K_P$ is set to a first gain value. When the selection signal $S_{SEL}$ indicates that the CDR circuit 200 operates in the CDR mode, the gain $K_P$ can be set to a second gain value less than the first gain value. As a result, the conversion circuit 242 operating in the PLL mode can serve as a gain conversion circuit for coarse tracking, while the conversion circuit 242 operating in the CDR mode can serve as a gain conversion circuit for fine tracking. In the present embodiment, the conversion circuit 242 may include a voltage-to-current converter 243, which can be implemented using a variable-gain voltage-to-current converter.

The conversion circuit 246 is configured to convert the up signal UP and the down signal DN with the gain $K_I$ to generate an input signal $S_{IN1}$, which can serve as an embodiment of an input signal in the set of input signals $\{S_{IN}\}$ shown in FIG. 1. In the present embodiment, a gain value of the gain $K_I$ in the PLL mode may be equal to a gain value of the second gain in the CDR mode. By way of example but not limitation, the conversion circuit 246 may include a charge pump 247 and a filter circuit 248 connected in cascade. When the up signal UP is at a predetermined logic level, the charge pump 247 is configured to inject current into the filter circuit 248. When the down signal DN is at a predetermined logic level, the charge pump 247 is configured to draw current from the filter circuit 248. With the use of the charge pump 247 and the filter circuit 248, the conversion circuit 246 may apply the gain $K_I$ to the up signal UP and the down signal DN, wherein the gain $K_I$ has a same gain value in the PLL mode and the CDR mode.

In some embodiments where the gain $K_I$ has a same gain value in the PLL mode and the CDR mode, the gain value of the gain $K_P$ in the PLL mode (represented by $K_{P\_PLL}$) can be determined based on the gain value of the gain $K_P$ in the CDR mode (represented by $K_{P\_CDR}$) to achieve good stability of the CDR circuit 200 operating in the PLL mode. Consider an example where $K_{P\_PLL}$ is designed to be M times greater than $K_{P\_CDR}$. Also, the gain $K_I$ can have a same gain value in the PLL mode and the CDR mode. A ratio of a stabilizing zero $\omega_{Z\_PLL}$ to a cutoff frequency $\omega_{-3dB\_PLL}$ of the CDR circuit 200 operating in the PLL mode can be determined by the following expression:

$$\omega_{ZPLL} : \omega_{-3dBPLL} = \frac{1}{M} : \frac{M \times K_{P_{CDR}}}{N},$$

where N represents a division factor of the frequency divider 260. As a result, M can be determined according to the gain value of the gain $K_P$ in the CDR mode, the division factor of the frequency divider 260, and the ratio of the stabilizing zero $\omega_{Z\_PLL}$ to the cutoff frequency $\omega_{-3dB\_PLL}$. For example, the ratio of the stabilizing zero $\omega_{Z\_PLL}$ to the cutoff frequency $\omega_{-3dB\_PLL}$ can be designed to be 1:R to achieve good PLL stability. M can be determined by the following expression:

$$M = \sqrt{\frac{R \times N}{K_{P\_CDR}}},$$

wherein $K_{P\_CDR}$ can be designed according to a predetermined CDR loop bandwidth. As $K_{P\_CDR}$ can be set to provide a sufficient CDR loop bandwidth, and R can be set to provide good PLL stability, the CDR circuit 200 can have good operating performance not only in the CDR mode but also in the PLL mode.

The oscillator 250, coupled to the conversion circuits 242 and 246, is configured to generate the oscillating signal $CK_{OUT}$ according to the input signals $S_{INP}$ and $S_{IN1}$. In the present embodiment, when the CDR circuit 200 operates in the CDR mode, the multiplexer circuit 230 and the conversion circuit 242 may form at least a portion of a proportional path between the PD 210 and the oscillator 250. Also, the multiplexer circuit 230 and the conversion circuit 246 may form at least a portion of an integral path between the PD 210 and the oscillator 250. Similarly, when the CDR circuit 200 operates in the PLL mode, the multiplexer circuit 230 and the conversion circuit 242 may form at least a portion of a proportional path between the PFD 220 and the oscillator 250. The multiplexer circuit 230 and the conversion circuit 246 may form at least a portion of an integral path between the RFD 220 and the oscillator 250.

In operation, when the CDR circuit 200 operates in the PLL mode, the up signal UP and the down signal DN outputted from the multiplexer circuit 230 may come from the up signal $UP_{PLL}$ and the down signal $DN_{PLL}$, respectively. The conversion circuit 246, included in the integral path for coarse tuning, can convert the up signal UP and the down signal DN with the gain $K_I$ to generate the input signal $S_{IN1}$. The conversion circuit 242, included in the proportional path for fine tuning, can convert the up signal UP and the down signal DN with the gain $K_P$ to generate the input signal $S_{INP}$. The oscillator 250 may output the oscillating signal $CK_{OUT}$ according to the input signals $S_{INP}$ and $S_{IN1}$. The frequency divider 260 may generate the frequency-divided signal $CK_{FB}$ according to the oscillating signal $CK_{OUT}$. The PFD 220 may compare the frequency-divided signal $CK_{FB}$ with the reference clock signal $CK_R$ to update the up signal $UP_{PLL}$ and the down signal $DN_{BLF}$.

After the oscillating signal $CK_{OUT}$ is locked to the reference clock signal $CK_R$, signal level or signal pattern of the selection signal Sari, may change to indicate that the CDR circuit 200 operates in the CDR mode. The up signal UP and the down signal DN outputted from the multiplexer circuit 230 may come from the up signal $UP_{CDR}$ and the down signal $DN_{CDR}$, respectively. The conversion circuit 242 may convert the up signal UP and the down signal DN with the gain $K_P$ to generate the input signals $S_{INP}$, wherein the gain value of the gain $K_P$ in the CDR mode is different from that in the PLL mode. The conversion circuit 246 may convert the up signal UP and the down signal DN with the gain $K_I$ to generate the input signals $S_{IN1}$, wherein the gain value of the gain $K_I$ is kept constant for both of the CDR mode and the PLL mode. Next, the oscillator 250 may receive the input signals $S_{INP}$ and $S_{IN1}$, outputted from the conversion circuits 242 and 246 respectively, to generate the oscillating signal $CK_{OUT}$. The PD 210 may compare the oscillating signal $CK_{OUT}$ with the data signal $D_{IN}$ to update the up signal $UP_{CDR}$ and the down signal $DN_{CDR}$. In the present embodiment, the PD 210 may sample different quadrature phases of the oscillating signal $CK_{OUT}$ at each data edge of the data signal $D_{IN}$, thereby detecting the difference in phase between the data signal $D_{IN}$ and the oscillating signal $CK_{OUT}$. By way of example but not limitation, the PD 210 may be implemented using a bang-bang phase detector, which can sample four quadrature phases I+, I−, Q+ and Q− of the oscillating signal $CK_{OUT}$ at each data edge of the data signal $D_{IN}$.

It is worth noting that, when the CDR circuit 200 operates in the CDR mode, at least one of the PFD 220 and the frequency divider 260 may be kept functionally inactive. Additionally, or alternatively, the PD 210 may be kept functionally inactive when the CDR circuit 200 operates in the PLL mode. With the use of the conversion circuits 242 and 246 shared by the CDR mode and the PLL mode, the CDR circuit 200 can have a simplified design, a relatively small circuit area and reduced manufacturing costs.

The above circuit implementations are provided for illustrative purposes, and are not intended to limit the scope of the present disclosure. Iii some embodiments, the PD 210 can be implemented using other types of phase sensitive detectors. In some embodiments, the conversion circuit 242 can be implemented using other types of variable-gain conversion circuits. In some embodiments, the conversion circuit 246 can be implemented using other types of conversion circuits capable of provide a same gain value for both of the CDR mode and the PLL mode. Associated modifications and alternatives fall within the contemplated scope of the present disclosure.

Figure 3:
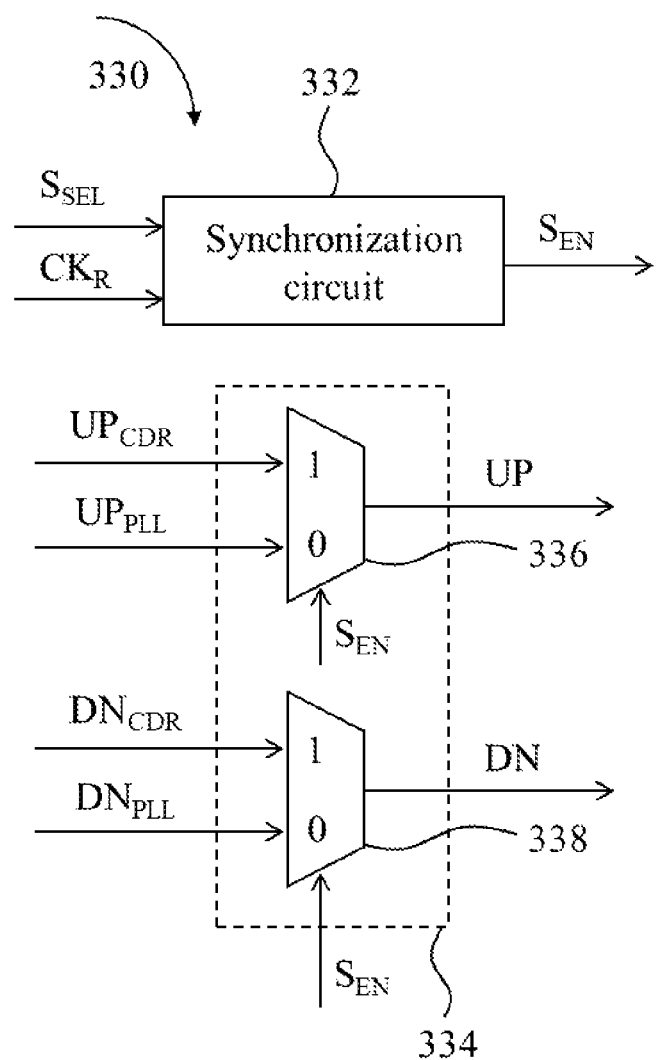
FIG. 3 illustrates an implementation of the multiplexer circuit shown in FIG. 2 in accordance with some embodiments of the present disclosure.

In the embodiment shown in FIG. 2, the multiplexer circuit 230 may synchronize the signal selection with the reference clock signal $CK_R$, thereby reducing glitches occurring within the multiplexer circuit 230. FIG. 3 illustrates an implementation of the multiplexer circuit 230 shown in FIG. 2 in accordance with some embodiments of the present disclosure. Referring to FIG. 3 and also to FIG. 2, the multiplexer circuit 330, coupled to the PD 210 and PFD 220, is configured to output one of the set of error signals $\{S_{ER1}\}$ and the set of error signals $\{S_{ER2}\}$ as the set of error signals $\{S_{ER}\}$. The multiplexer circuit 330 includes, but is not limited to, a synchronization circuit 332 and a selection circuit 334.

The synchronization circuit 332 is configured to sample the selection signal $S_{SEL}$ according to the reference clock signal $CK_R$, and accordingly generate an enable signal $S_{EN}$. For example, the synchronization circuit 332 may sample the selection signal $S_{SEL}$ at a signal edge of the reference clock signal $CK_R$, and generate the enable signal $S_{EN}$ at another signal edge of the reference clock signal $CK_R$, which occurs after the signal edge of the reference clock signal $CK_R$. As another example, the synchronization circuit 332 may sample the selection signal $S_{SEL}$ at a first signal edge of the reference clock signal $CK_R$, and generate the enable signal $S_{EN}$ at a second signal edge of the reference clock signal $CK_R$ different from the first signal edge. One of the first signal edge and the second signal edge may be a rising edge of the reference clock signal $CK_R$, and the other of the first signal edge and the second signal edge may a falling edge of the reference clock signal $CK_R$.

The selection circuit 334, coupled to the synchronization circuit 332, is configured to selectively output the set of error signals $\{S_{ER1}\}$ or the set of error signals $\{S_{ER2}\}$ as the set of error signals $\{S_{ER}\}$ according to the enable signal $S_{EN}$. In the present embodiment, the selection circuit 334 may include a plurality of multiplexers 336 and 338. The multiplexer 336 is configured to selectively output one of the up signal $UP_{CDR}$ and the up signal $UP_{PLL}$ as the up signal UP according to the enable signal $S_{EN}$. The up signal UP generated by the multiplexer 336 may serve as a control signal provided for the oscillator 250. The multiplexer 336 can be configured to increase a frequency of the oscillator 250 according to the control signal, i.e. the up signal UP. Similarly, the multiplexer 338 is configured to selectively output one of the down signal $DN_{CDR}$ and the down signal $DN_{PLL}$ as the down signal DN according to the enable signal $S_{EN}$. The down signal DN generated by the multiplexer 338 may serve as another control signal provided for the oscillator 250. The multiplexer 338 can be configured to decrease the frequency of the oscillator 250 according to the another control signal, i.e. the down signal DN.

Figure 4:
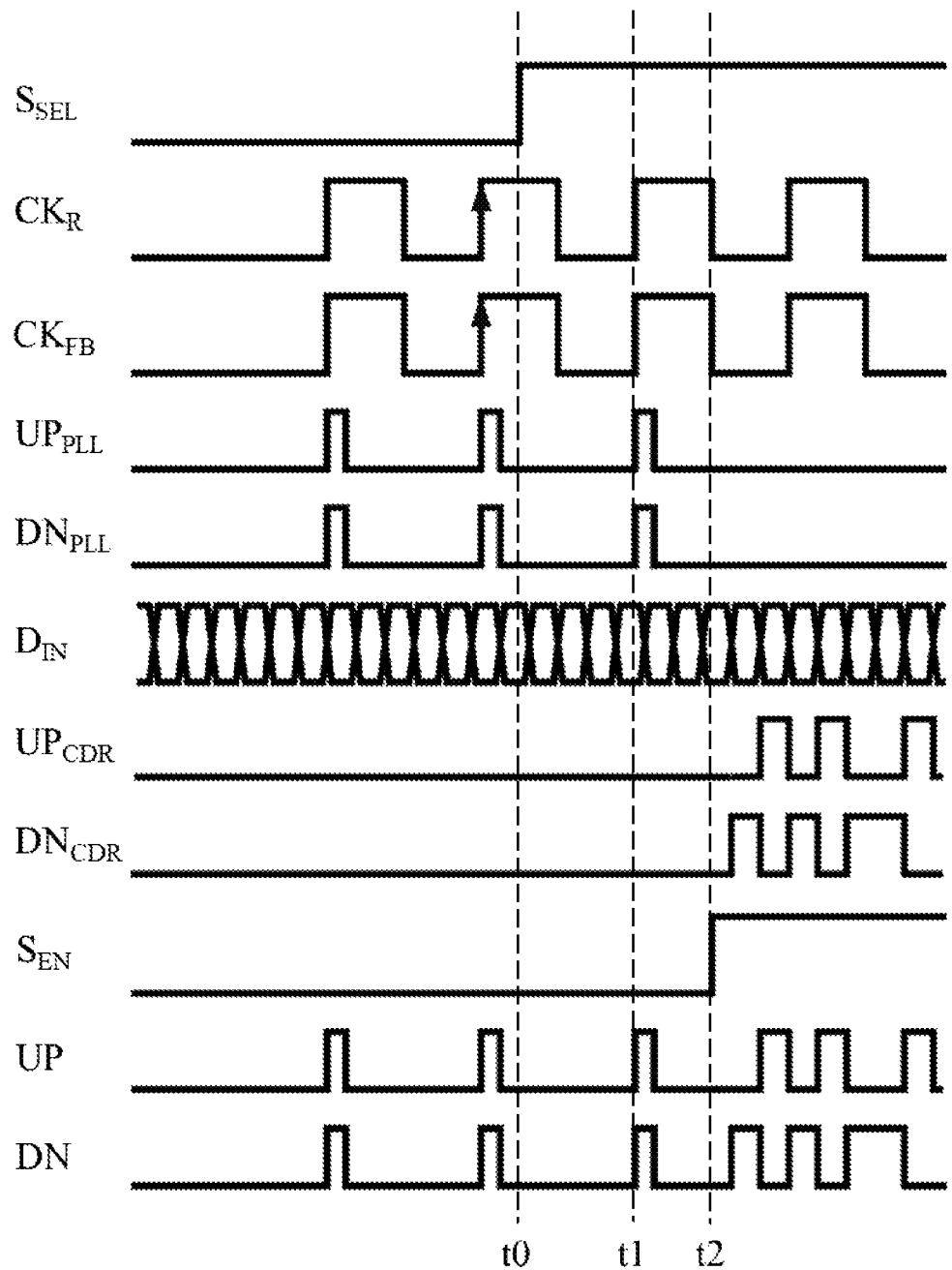
FIG. 4 illustrates signal waveforms associated with operation of the multiplexer circuit shown in FIG. 3 in accordance with some embodiments of the present disclosure.

FIG. 4 illustrates signal waveforms associated with operation of the multiplexer circuit 330 shown in FIG. 3 in accordance with some embodiments of the present disclosure. Referring to FIG. 2, FIG. 3 and FIG. 4, prior to time t0, the selection signal $S_{SEL}$ indicates that the CDR circuit 200 operates in the PLL mode. As the PFD 220 is positive edge triggered in the present embodiment, respective rising edges of the up signal $UP_{PLL}$ and the down signal $DN_{PLL}$ can be aligned with a rising edge of the reference clock signal $CK_R$. The multiplexer 336 can output the up signal $UP_{PLL}$, as the up signal UP according to the enable signal $S_{EN}$. The multiplexer 338 can output the down signal $DN_{PLL}$ as the down signal DN according to the enable signal $S_{EN}$. In addition, the frequency-divided signal $CK_{FB}$ is locked to the reference clock signal $CK_R$ prior to time t0.

At time t0, the selection signal $S_{SEL}$ may transition from a low level to a high level, which indicates that the CDR circuit 200 is switched to the CDR mode. Next, the synchronization circuit 332 can sample the selection signal $S_{SEL}$ at a rising edge of the reference clock signal $CK_R$, i.e. at time t1. At a falling edge of the reference clock signal $CK_R$ which occurs after time t1, the synchronization circuit 332 can generate the enable signal $S_{EN}$ to trigger the signal selection of the multiplexers 336 and 338. For example, at time t2, the enable signal $S_{EN}$ may transition from a low level to a high level. After time t2, the multiplexer 336 can output the up signal $UP_{CDR}$ as the up signal UP according to the enable signal $S_{EN}$, and the multiplexer 338 can output the down signal $DN_{CDR}$ as the down signal DN according to the enable signal $S_{EN}$.

Figure 5:
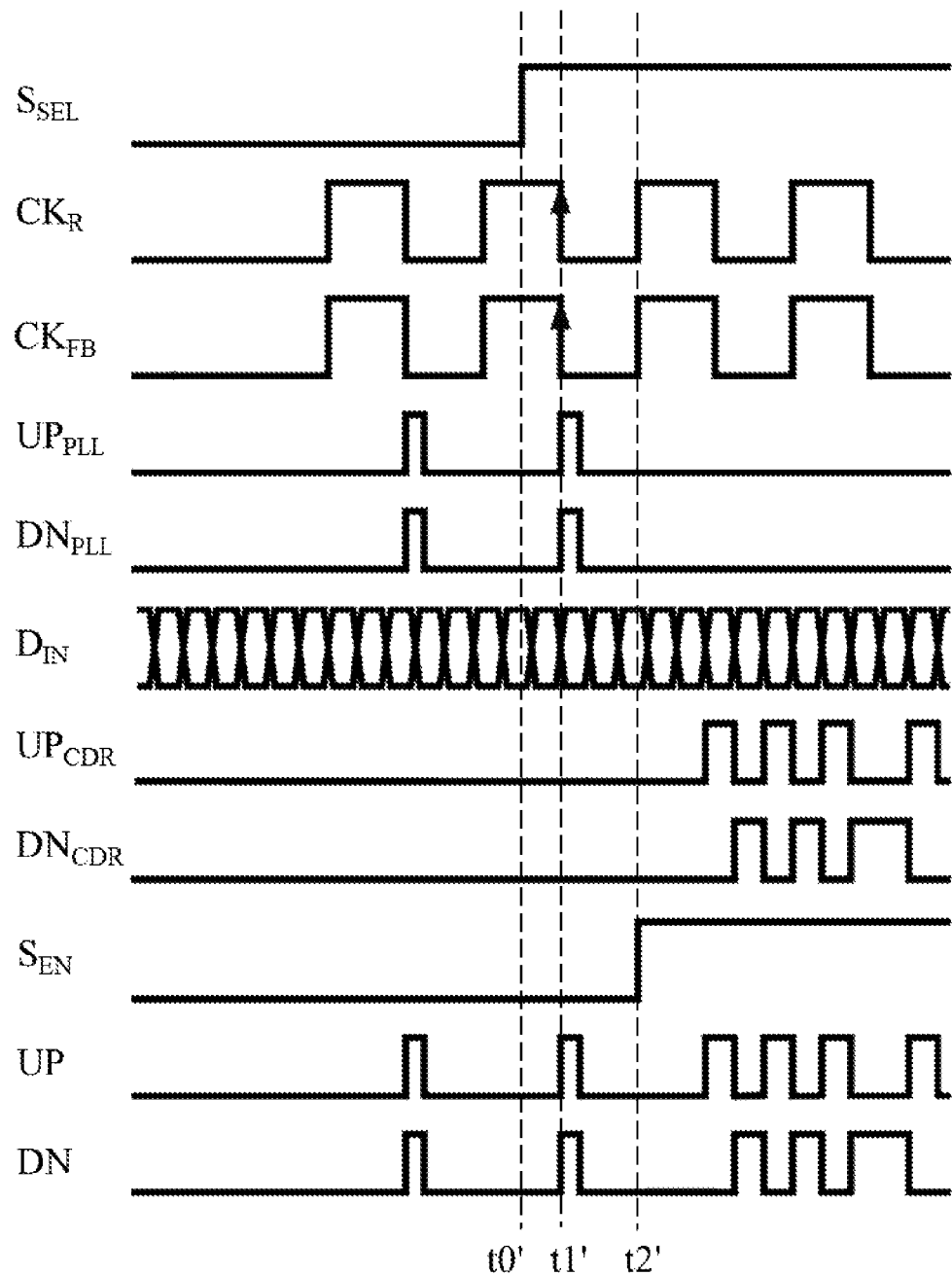
FIG. 5 illustrates signal waveforms associated with operation of the multiplexer circuit shown in FIG. 3 in accordance with some embodiments of the present disclosure.

FIG. 5 illustrates signal waveforms associated with operation of the multiplexer circuit 330 shown in FIG. 3 in accordance with some embodiments of the present disclosure. The signal waveforms shown in FIG. 5 are similar/identical to those shown in FIG. 4 except that, for example, respective rising edges of the up signal $UP_{PLL}$ and the down signal $DN_{PLL}$ can be aligned with a falling edge of the reference clock signal $CK_R$ since the PFD 220 shown in FIG. 2 is negative edge triggered.

Referring to FIG. 2, FIG. 3 and FIG. 5, prior to time t0', the selection signal $S_{SEL}$ indicates that the CDR circuit 200 operates in the PLL mode. In addition, the frequency-divided signal $CK_{FB}$ is locked to the reference clock signal $CK_R$ prior to time t0'. The selection signal $S_{SEL}$ may transition from a low level to a high level at time t0', which indicates that the CDR circuit 200 is switched to the CDR mode. Next, the synchronization circuit 332 can sample the selection signal S at a falling edge of the reference clock signal $CK_R$, i.e. at time t1'. At a rising edge of the reference clock signal $CK_R$ which occurs after time t1', the synchronization circuit 332 can generate the enable signal $S_{EN}$ to trigger the signal selection of the multiplexers 336 and 338. For example, at time t2', the enable signal $S_{EN}$ may transition from a low level to a high level. After time t2', the multiplexer 336 can output the up signal $UP_{CDR}$ as the up signal UP according to the enable signal $S_{EN}$, and the multiplexer 338 can output the down signal $DN_{CDR}$ as the down signal DN according to the enable signal $S_{EN}$. As those skilled in the art can appreciate the generation of the signal waveforms shown in FIG. 5 after reading the above paragraphs directed to FIG. 1 through FIG. 4, further description is omitted here for brevity.

With the use of the proposed multiplexing scheme, signal selection can be synchronized with a clock signal, such as a reference clock signal for triggering a phase frequency detector employed for a phase-locked loop, to thereby reduce glitches induced during the signal selection.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A clock and data recovery (CDR) circuit, comprising:
   a phase detector (PD), configured to detect a difference in phase between a data signal and an oscillating signal to generate a first set of error signals;
   a phase frequency detector (PFD), configured to detect a difference in phase and frequency between a reference clock signal and the oscillating signal to generate a second set of error signals;
   a multiplexer circuit, coupled to the PD and the PFD, the multiplexer circuit being configured to selectively output the first set of error signals or the second set of error signals as a third set of error signals according to a selection signal;
   a conversion stage, coupled to the multiplexer circuit, the conversion stage being configured to determine a set of gains according to the selection signal, and convert the third set of error signals with the set of gains to generate a set of input signals; and
   an oscillator, coupled to the conversion stage, the oscillator being configured to generate the oscillating signal according to the set of input signals;
   wherein the conversion stage comprises:
   a first conversion circuit, configured to adjust a first gain in the set of gains according to the selection signal, and convert the third set of error signals with the first gain to generate a first input signal in the set of input signals; and
   a second conversion circuit, configured to convert the third set of error signals with a second gain in the set of gains to generate a second input signal in the set of input signals.

2. The CDR circuit of claim 1, wherein the first conversion circuit is formed in a first path between the multiplexer circuit and the oscillator, and the second conversion circuit is formed in a second path between the multiplexer circuit and the oscillator; the second path is separated from the first path.

3. The CDR circuit of claim 1, wherein when the selection signal indicates that the CDR circuit operates in a phase-locked loop (PLL) mode, the first gain is set to a first gain value; when the selection signal indicates that the CDR circuit operates in a CDR mode, the first gain is set to a second gain value less than the first gain value.

4. The CDR circuit of claim 1, wherein a gain value of the second gain in a PLL mode is equal to a gain value of the second gain in a CDR mode.

5. The CDR circuit of claim 1, wherein the first conversion circuit comprises a voltage-to-current converter.

6. The CDR circuit of claim 1, wherein the second conversion circuit comprises a charge pump and a filter circuit connected in cascade.

7. The CDR circuit of claim 1, wherein when the selection signal indicates that the CDR circuit operates in a CDR mode, the multiplexer circuit is configured to output the first set of error signals as the third set of error signals according to the selection signal; when the selection signal indicates that the CDR circuit operates in a PLL mode, the multiplexer circuit is configured to output the second set of error signals as the third set of error signals according to the selection signal.

8. The CDR circuit of claim 1, wherein the first set of error signals comprises a first up signal and a first down signal; the second set of error signals comprises a second up signal and a second down signal; the third set of error signals comprises a third up signal and a third down signal; the multiplexer circuit comprises:
   a synchronization circuit, configured to sample the selection signal according to the reference clock signal and accordingly generate an enable signal;
   a first multiplexer, coupled to the PD, the PFD and the synchronization circuit, the first multiplexer being configured to selectively output one of the first up signal and the second up signal as the third up signal according to the enable signal; and
   a second multiplexer, coupled to the PD, the PFD and the synchronization circuit, the second multiplexer being configured to selectively output one of the first down signal and the second down signal as the third down signal according to the enable signal.

9. The CDR circuit of claim 8, wherein when the PFD is positive edge triggered, the synchronization circuit is configured to sample the selection signal at a rising edge of the reference clock signal, and generate the enable signal at a falling edge of the reference clock signal.

10. The CDR circuit of claim 8, wherein when the PFD is negative edge triggered, the synchronization circuit is configured to sample the selection signal at a falling edge of the reference clock signal, and generate the enable signal at a rising edge of the reference clock signal.

11. The CDR circuit of claim 1, further comprising:
   a frequency divider, coupled between the oscillator and the PFD, the frequency divider being configured to receive the oscillating signal to generate a frequency-divided signal, wherein the PFD is configured to receive the reference clock signal and the frequency-divided signal to detect the difference in phase and frequency between the reference clock signal and the oscillating signal.

12. The CDR circuit of claim 11, wherein
   the first gain is set to a first gain value when the selection signal indicates that the CDR circuit operates in a PLL mode, the first gain is set to a second gain value when the selection signal indicates that the CDR circuit operates in a CDR mode, the first gain value is M times greater than the second gain value;
   a gain value of the second gain in the PLL mode is equal to a gain value of the second gain in the CDR mode;
   wherein M is determined by the following expression:

$$M = \sqrt{\frac{R \times N}{K_{P\_CDR}}};$$

wherein KP_CDR is the second gain value, N is a division factor of the frequency divider, and R is a ratio of a cutoff frequency to a stabilizing zero of the CDR circuit operating in the PLL mode.

13. A clock and data recovery (CDR) circuit, comprising:
   a phase detector (PD), configured to detect a difference in phase between a data signal and an oscillating signal to generate a first set of error signals;
   a phase frequency detector (PFD), configured to detect a difference in phase and frequency between a reference clock signal and the oscillating signal to generate a second set of error signals;
   a synchronization circuit, configured to sample a selection signal at a first signal edge of the reference clock signal, and accordingly generate an enable signal at a second signal edge of the reference clock signal different from the first signal edge;

a selection circuit, coupled to the PD, the PFD and the synchronization circuit, the selection circuit being configured to selectively output the first set of error signals or the second set of error signals as a third set of error signals according to the enable signal;

a conversion stage, coupled to the selection circuit, the conversion stage being configured to convert the third set of error signals with a set of gains to generate a set of input signals; and an oscillator, coupled to the conversion stage, the oscillator being configured to generate the oscillating signal according to the set of input signals.

14. The CDR circuit of claim 13, wherein one of the first signal edge and the second signal edge is a rising edge, and the other of the first signal edge and the second signal edge is a falling edge.

15. The CDR circuit of claim 13, wherein the first set of error signals comprises a first up signal and a first down signal; the second set of error signals comprises a second up signal and a second down signal; the third set of error signals comprises a third up signal and a third down signal; the selection circuit comprises:

a first multiplexer, coupled to the PD and the PFD, the first multiplexer being configured to selectively output one of the first up signal and the second up signal as the third up signal according to the enable signal; and a second multiplexer, coupled to the PD and the PFD, the second multiplexer being configured to selectively output one of the first down signal and the second down signal as the third down signal according to the enable signal.

16. The CDR circuit of claim 13, wherein the conversion stage comprises:

a first conversion circuit, configured to adjust a first gain in the set of gains according to the selection signal, and convert the third set of error signals with the first gain to generate a first input signal in the set of input signals; and a second conversion circuit, configured to convert the third set of error signals with a second gain in the set of gains to generate a second input signal in the set of input signals.

17. The CDR circuit of claim 16, wherein when the CDR circuit operates in a phase-locked loop (PLL) mode, the first gain is set to a first gain value; when the CDR circuit operates in a CDR mode, the first gain is set to a second gain value less than the first gain value.

18. The CDR circuit of claim 16, wherein a gain value of the second gain in a PLL mode is equal to a gain value of the second gain in a CDR mode.

19. The CDR circuit of claim 13, further comprising:

a frequency divider, coupled between the oscillator and the PFD, the frequency divider being configured to receive the oscillating signal to generate a frequency-divided signal, wherein the PFD is configured to receive the reference clock signal and the frequency-divided signal to detect the difference in phase and frequency between the reference clock signal and the oscillating signal.

20. The CDR circuit of claim 19, wherein the conversion stage comprises:

a first conversion circuit, configured to convert the third set of error signals with a first gain in the set of gains to generate a first input signal in the set of input signals, the first gain being set to a first gain value when the selection signal indicates that the CDR circuit operates in a PLL mode, the first gain being set to a second gain value when the selection signal indicates that the CDR circuit operates in a CDR mode, the first gain value being M times greater than the second gain value; and a second conversion circuit, configured to convert the third set of error signals with a second gain in the set of gains to generate a second input signal in the set of input signals, a gain value of the second gain in the PLL mode is equal to a gain value of the second gain in the CDR mode;

wherein M is determined by the following expression:

$$M = \sqrt{\frac{R \times N}{K_{P\_CDR}}};$$

wherein KP_CDR is the second gain value, N is a division factor of the frequency divider, and R is a ratio of a cutoff frequency to a stabilizing zero of the CDR circuit operating in the PLL mode.

21. A multiplexer circuit, comprising:

a synchronization circuit, configured to sample a selection signal at a first signal edge of a reference clock signal, and generate an enable signal at a second signal edge of the reference clock signal different from the first signal edge, wherein one of the first signal edge and the second signal edge is a rising edge, and the other of the first signal edge and the second signal edge is a falling edge;

a first multiplexer, coupled to the synchronization circuit, the first multiplexer being configured to receive a first up signal outputted from a phase detector (PD) and a second up signal outputted from a phase frequency detector (PFD), output one of the first up signal and the second up signal as a first control signal according to the enable signal, and increase a frequency of an oscillator according to the first control signal; and a second multiplexer, coupled to the synchronization circuit, the second multiplexer being configured to receive a first down signal outputted from the PD and a second down signal outputted from the PFD, output one of the first down signal and the second down signal as a second control signal according to the enable signal, and decrease the frequency of the oscillator according to the second control signal.

* * * * *